United States Patent
Rangarajan et al.

(10) Patent No.: US 8,749,316 B2
(45) Date of Patent: Jun. 10, 2014

(54) PROGRAMMABLE VARACTOR AND METHODS OF OPERATION THEREOF

(75) Inventors: Rajagopalan Rangarajan, San Diego, CA (US); Ojas M Choksi, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 165 days.

(21) Appl. No.: 12/821,071

(22) Filed: Jun. 22, 2010

(65) Prior Publication Data

US 2010/0321137 A1    Dec. 23, 2010

Related U.S. Application Data

(60) Provisional application No. 61/219,746, filed on Jun. 23, 2009.

(51) Int. Cl.
*H03B 5/12* (2006.01)
*H03B 5/18* (2006.01)
*H03C 3/22* (2006.01)

(52) U.S. Cl.
USPC ............. 331/177 V; 331/36 C; 331/116 R; 331/116 FE; 331/116 M; 331/117 R; 331/117 FE

(58) Field of Classification Search
USPC ...... 331/36 C, 116 R, 116 FE, 116 M, 117 R, 331/117 FE, 117 D, 177 R, 177 V
See application file for complete search history.

(56) References Cited

U.S. PATENT DOCUMENTS

| | | | | |
|---|---|---|---|---|
| 5,030,926 A | * | 7/1991 | Walden | 331/116 FE |
| 5,821,818 A | * | 10/1998 | Idei et al. | 331/17 |
| 5,990,761 A | * | 11/1999 | Hamparian et al. | 333/164 |
| 6,396,356 B1 | | 5/2002 | Mehta et al. | |
| 6,563,392 B2 | * | 5/2003 | Gomez et al. | 331/117 FE |
| 6,731,181 B2 | * | 5/2004 | Fukayama et al. | 331/176 |
| 6,847,095 B2 | | 1/2005 | Benaissa et al. | |
| 6,882,237 B2 | * | 4/2005 | Singh et al. | 331/185 |
| 7,129,801 B2 | | 10/2006 | Wu | |
| 7,301,412 B2 | * | 11/2007 | Moribe et al. | 331/177 V |
| 7,567,120 B2 | * | 7/2009 | Kottschlag | 327/586 |

(Continued)

FOREIGN PATENT DOCUMENTS

| | | |
|---|---|---|
| DE | 4011839 A1 | 10/1991 |
| GB | 1244053 A | 8/1971 |
| GB | 2349525 A | 11/2000 |

OTHER PUBLICATIONS

International Search Report and Written Opinion—PCT/US2010/039688, ISA/EPO—May 18, 2011.

(Continued)

*Primary Examiner* — Arnold Kinkead
*Assistant Examiner* — Richard Tan
(74) *Attorney, Agent, or Firm* — Linda G. Gunderson

(57) ABSTRACT

Exemplary embodiments are directed to a programmable varactor device. A varactor device may include an input device configured to receive a tuning voltage and generate a bias voltage at least partially dependent on the tuning voltage. The varactor device may also include a varactor pair coupled to the input device and having a first variable capacitor and a second variable capacitor, wherein each of the first variable capacitor and a second variable capacitor are configured for operable coupling to each of the bias voltage and the tuning voltage.

11 Claims, 9 Drawing Sheets

(56) References Cited

U.S. PATENT DOCUMENTS

| 7,612,626 | B2 | 11/2009 | Tang |
| 7,990,227 | B2 * | 8/2011 | Schechinger ............. 331/177 V |
| 2005/0099249 | A1 | 5/2005 | Lai |

2007/0241834 A1 * 10/2007 Lee ........................... 331/177 V

OTHER PUBLICATIONS

Taiwan Search Report—TW099120513—TIPO—Jul. 24, 2013.

* cited by examiner

PROGRAMMABLE VARACTOR AND METHODS OF OPERATION THEREOF

CLAIM OF PRIORITY UNDER 35 U.S.C. §119

This application claims priority under 35 U.S.C. §119(e) to:

U.S. Provisional Patent Application 61/219,746 entitled "METHOD AND APPARATUS FOR NOVEL PROGRAMMABLE LINEAR VARACTOR" filed on Jun. 23, 2009, the disclosure of which is hereby incorporated by reference in its entirety.

BACKGROUND

1. Field

The present invention relates generally to varactors, and more specifically to a programmable varactor device including a single varactor pair.

2. Background

As will be appreciated by a person having ordinary skill in the art, a varactor is generally a device designed to take advantage of variations in its reactance. A varactor may be thought of as a variable voltage capacitor. As a voltage is applied to a varactor, the capacitance of the varactor generally increases. Varactors may be used in various types of tuning circuits. As an example, varactors may be useful in certain oscillator circuits, such as oscillator circuits commonly used in communications devices. The operating frequency of an LC oscillator circuit, for example, may be controlled or tuned by varying the voltage across the terminals of a varactor. As another example, a varactor may be used in the tuning mechanism of a radio receiver or another device requiring frequency tuning.

Voltage controlled oscillator (VCO) circuits are well known in the art and are utilized in a number of applications. For example, VCO circuits are used in phase-locked loop (PLL) circuits in high frequency applications such as wireless communications. A PLL is a component used in communications circuitry that enables communications equipment to quickly "lock" onto a specifically selected frequency, typically the carrier frequency over which communications are sent. This fast locking ability is particularly important for devices such as cellular telephones, where the cell phones are desired to instantly switch carrier frequencies when traveling through different cellular zones or "cells". A VCO is an essential component of a PLL, whose output voltage is controllable by the application of an input control voltage. However, a VCO is very sensitive to fluctuations in a control voltage. The sensitivity of a VCO is typically expressed as MHz per volt.

Typically, a VCO circuit includes a variable element such as a capacitor that may be varied to adjust the frequency of an output signal of the VCO circuit. In a LC tank based VCO circuit, the frequency of the VCO circuit is determined by the inductance (L) and capacitance (C) of the tank circuit. By utilizing a varactor to function as a capacitor in the LC tank circuit, the capacitance of the VCO circuit can be varied by changing the voltage applied to the varactor. Thus, the frequency of the LC tank based VCO circuit is varied accordingly.

FIG. 1 illustrates a conventional distributed bias varactor device 100 including a plurality of varactor pairs Cvar1/Cvar1', Cvar2/Cvar2' . . . Cvarn/Cvarn'. As illustrated in FIG. 1, each varactor pair Cvar1/Cvar1', Cvar2/Cvar2' . . . Cvarn/Cvarn' is coupled to a tuning voltage Vtune, which may be received from a PLL. Furthermore, each varactor pair Cvar1/Cvar1', Cvar2/Cvar2' . . . Cvarn/Cvarn' is coupled to a bias voltage through an associated resistor (e.g., varactor Cvar1 is coupled to bias voltage Vbias1 through resistor Rb1). As will be understood by a person having ordinary skill in the art, each resistor within varactor system 100 may increase noise and, as a result, for each varactor within varactor system 100, the noise is increased. Moreover, because each varactor is capacitively coupled to a tank voltage (e.g., Cvar1 is coupled to tank voltage Vtank+ via fixed coupling capacitor Cc1), the tuning range of varactor system 100 may be reduced.

A need exists for a programmable varactor, which may provide increased tuning range and decreased noise compared to a conventional varactor system.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Various exemplary embodiments as described herein relate to a varactor device having a single varactor pair including a first variable capacitor and a second variable capacitor. In contrast to conventional varactor devices, exemplary embodiments of the present invention may be configured to reduce noise, increase tuning range, and enhancing linearity of an associated C-V curve.

Figure 1:
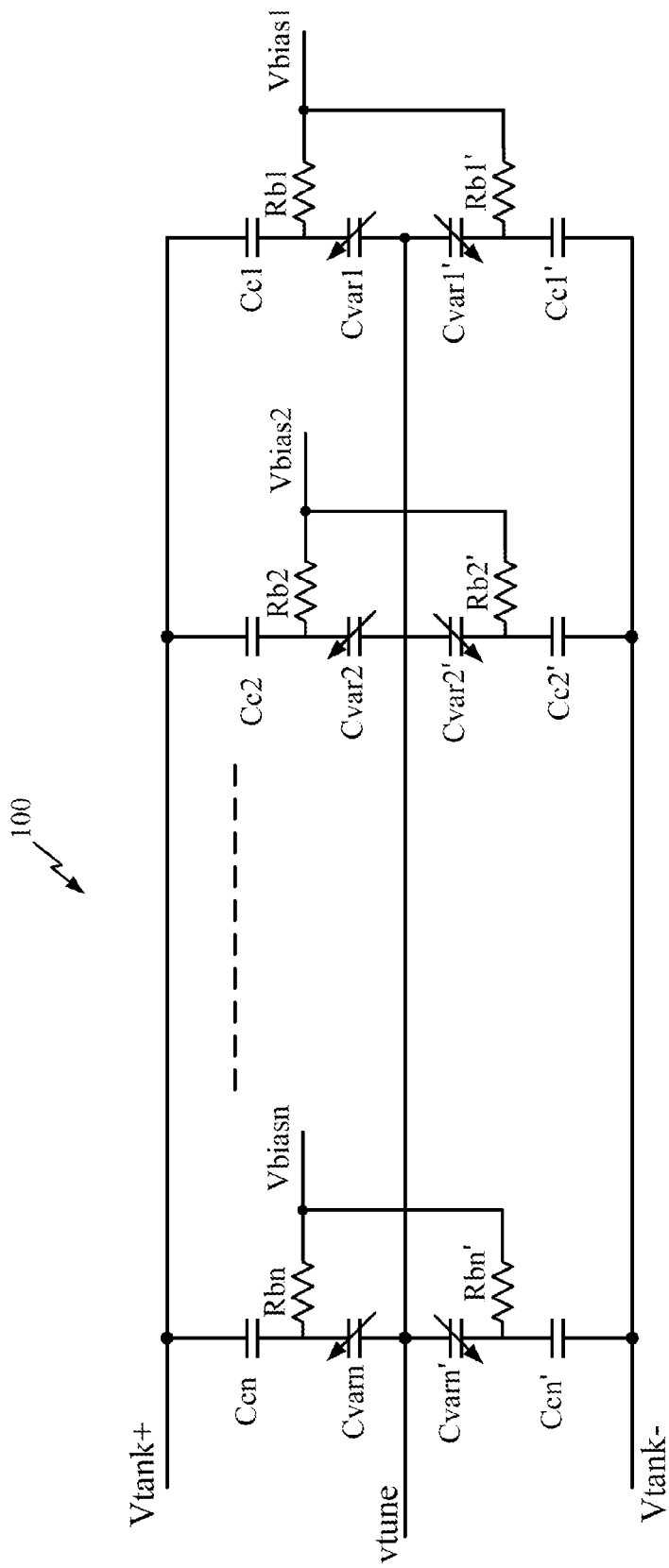
FIG. 1 is a conventional varactor device including a plurality of varactors, wherein each varactor is associated with a resistor for biasing the varactor.
Figure 2:
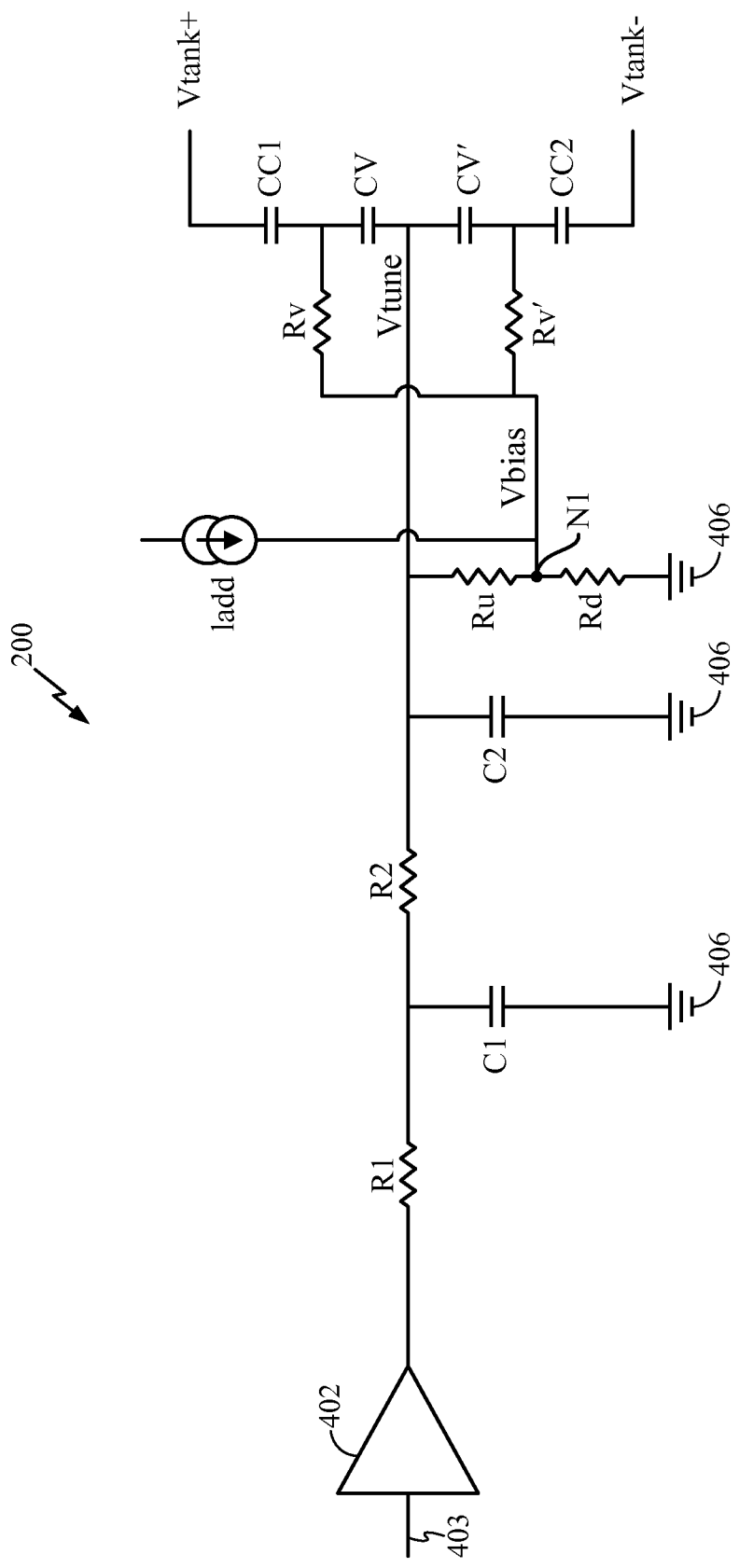
FIG. 2 is a circuit diagram of a varactor device, in accordance with an exemplary embodiment of the present invention.

FIG. 2 illustrates a circuit diagram of a varactor device 200, according to an exemplary embodiment of the present invention. Varactor device 200 includes fixed coupling capacitors CC1 and CC2 and variable capacitors CV and CV', wherein each of variable capacitors CV and CV' have one end coupled to tuning voltage Vtune and another end coupled to one end of an associated fixed coupling capacitor. Variable capacitors CV and CV' may also be commonly referred to herein as a "varactor pair." As illustrated in FIG. 2, fixed coupling capacitor CC1 has one end coupled to variable capacitor CV and another end coupled to positive tank voltage Vtank+. Moreover, fixed coupling capacitor CC2 has one end coupled to variable capacitor CV' and another end coupled to negative tank voltage Vtank−. It is noted that positive tank voltage Vtank+ and negative tank voltage Vtank− may be coupled to respective positive and negative terminals of an oscillator (not shown), such as, for example only, an LC tank oscillator.

Varactor device 200 further includes a buffer 402, which may comprise, for example, a unity gain buffer. Buffer 402 may be configured to receive an input 403, which may be coupled to another device, such as a PLL (not shown). Varactor device 200 may also include a first RC filter including a resistor R1 and a capacitor C1 and a second RC filter including a resistor R2 and a capacitor C2. By way of example only, resistor R1 and resistor R2 may each have a resistance of 800 ohms. Furthermore, as non-limiting examples, capacitor C1 may have a capacitance of 20 picofarads and capacitor C2 may have a capacitance of 18 picofarads.

Additionally, varactor device 200 may include a resistor Rd coupled in series between a ground voltage 406 and another resistor Ru. Furthermore, a node N1, which is positioned between resistors Rd and Ru, is coupled between variable capacitors CV and CV' and associated coupling capacitors CC1 and CC2 through resistors Rv and Rv', respectively. More specifically, for example, node N1, which is positioned between resistors Rd and Ru, is coupled between variable capacitor CV and associated coupling capacitors CC1 through resistor Rv. Furthermore, for example, node N1 is coupled between variable capacitor CV' and associated coupling capacitors CC2 through resistor Rv'. A voltage at node N1 comprises a bias voltage Vbias.

Varactor device 200 further includes a current source Iadd may be coupled to node N1. It is noted that values for resistors Ru and Rd may be selected so that a value of bias voltage Vbias is a fraction of a value of tuning voltage Vtune. It is noted that the resistor string including resistors Ru and Rd may be programmable so that bias voltage Vbias is a fraction of tuning voltage Vtune. As an example, the resistor string including resistors Ru and Rd may be configured so that the ratio of bias voltage Vbias to tuning voltage Vtune is, for example only, 0.2, 0.3, 0.4, 0.5, 0.6, 0.7, 0.8, or 0.9. Accordingly, the resistive values of resistors Ru and Rd may be programmable to meet implementation requirements. In addition, a value of a current generated by current source Iadd may be selected to modify bias voltage Vbias by a desired amount. More specifically, the current generated by current source Iadd multiplied by the resistance of resistor Rd equals an offset voltage for modifying bias voltage Vbias by a desired amount. The current generated by current source Iadd may maintain the center of a Kvco curve, as will be appreciated by a person having ordinary skill in the art.

A contemplated operation of varactor device 200 including example values for bias voltage Vbias and tuning voltage Vtune will now be discussed. Upon receipt of a voltage from a device, such as, for example, a PLL, buffer 402 may convey tuning voltage Vtune. Tuning voltage Vtune is coupled to one side of each of variable capacitors CV and CV'. Moreover, bias voltage Vbias, which is generated in part from tuning voltage Vtune (i.e., by the voltage divider including resistors Ru and Rd) and current source Iadd, is coupled to between variable capacitor CV and CV' and associated coupling capacitors CC1 and CC2 through resistors Rv and Rv', respectively. As described more fully below, bias voltage Vbias is at least partially dependent on tuning voltage Vtune.

In the following example resistors Ru and Rd are selected to provide a voltage at node N1 that is eighty percent (80%) of tuning voltage Vtune (i.e., the ratio of the voltage of node N1 to the voltage of tuning voltage Vtune is 0.8) and Iadd is configured to boost the voltage a node N1 by 0.2 volt (i.e., the "offset voltage" is 0.2 volt). Accordingly, by way of example only, if tuning voltage Vtune comprises a voltage of 0.5 volt, bias voltage Vbias comprises 0.6 volt (i.e., 0.5 volt*0.8+0.2 volt=0.6 volt). Furthermore, by way of example only, if tuning voltage Vtune comprises a voltage of 1.0 volt, bias voltage Vbias comprises 1.0 volt (i.e., 1.0 volt*0.8+0.2 volt=1.0 volt). Moreover, by way of example only, if tuning voltage Vtune comprises a voltage of 1.5 volts, bias voltage Vbias comprises 1.4 volts (i.e., 1.5 volts*0.8+0.2 volt=1.4 volts). As a result, if tuning voltage Vtune has a range of 1.0 volt (i.e., from 0.5 volt to 1.5 volts), a voltage across variable capacitors CV and CV' has a range of 0.2 volt (i.e., from −0.1 volt to 0.1 volt).

In comparison to conventional varactor devices, which comprise a plurality of varactor pairs, the exemplary embodiment described in regard to FIG. 2 comprises a single varactor pair. Accordingly, in comparison to conventional varactor devices, the varactor device described above in regard to FIG. 2 may enable for increased tuning range and decreased noise. Further, the varactor device may require less area than conventional varactor devices.

Figure 3:
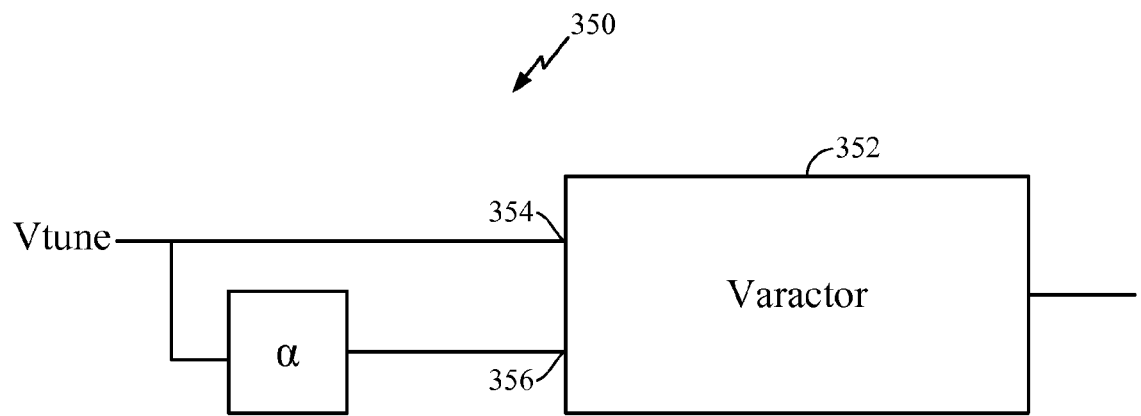
FIG. 3 is a simplified block diagram of varactor device, according to an exemplary embodiment of the present invention.

FIG. 3 illustrates a simplified block diagram of a varactor device 350, in accordance with the exemplary embodiment described above with reference to FIG. 2. Varactor device 350 includes a varactor 352 having a tuning node 354 configured to receive tunable voltage Vtune. Varactor 352 also includes bias node 356 configured to receive bias voltage Vbias. As described above with reference to FIG. 2, bias voltage may be derived from tunable voltage Vtune (i.e., bias voltage Vbias is a function of tuning voltage Vtune). More specifically, tuning voltage Vtune is multiplied by a factor alpha (i.e., a) to generate bias voltage Vbias. Stated another way, bias voltage Vbias is a ratio of tuning voltage Vtune and there is only one possible bias voltage Vbias for each tuning voltage Vtune. As a non-limiting example, alpha may comprise a value of 0.8. Accordingly, in this example, a voltage applied at bias node 356 is 80% of tuning voltage Vtune, which is applied to tuning node 354. Therefore, a voltage applied across the positive and negative terminals of varactor 352 is reduced, thus, reducing the voltage range and enhancing linearity of an associated C-V curve. It is noted that the "offset voltage," generated at least partially by current source Iadd and resistor Rd (see FIG. 2) is not illustrated in FIG. 3.

Figure 4:
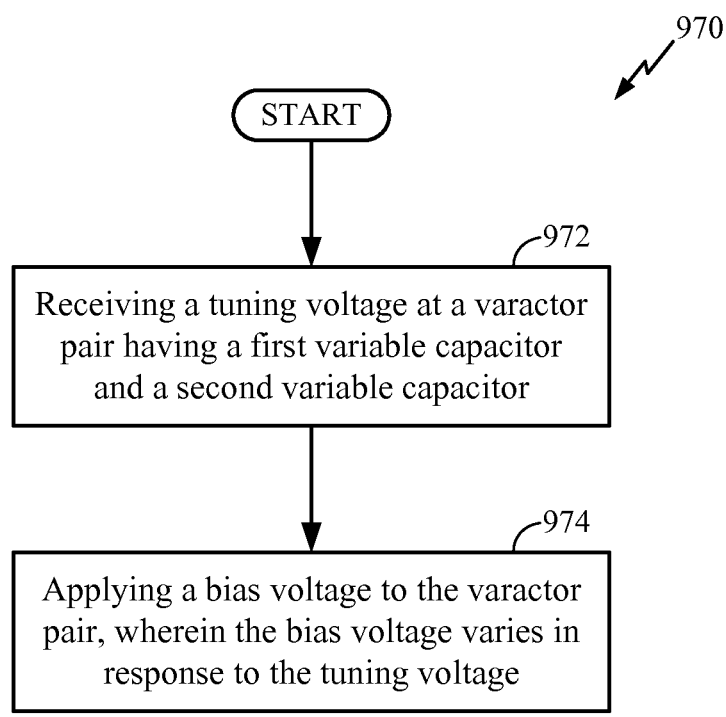
FIG. 4 is a flowchart illustrating a method, in accordance with an exemplary embodiment of the present invention.

FIG. 4 is a flowchart illustrating a method 970, in accordance with one or more exemplary embodiments. Method 970 may include receiving a tuning voltage at a varactor pair having a first variable capacitor and a second variable capacitor (depicted by numeral 972). Method 970 may further include applying a bias voltage to the varactor pair, wherein the bias voltage varies in response to the tuning voltage (depicted by numeral 974).

Figure 5:
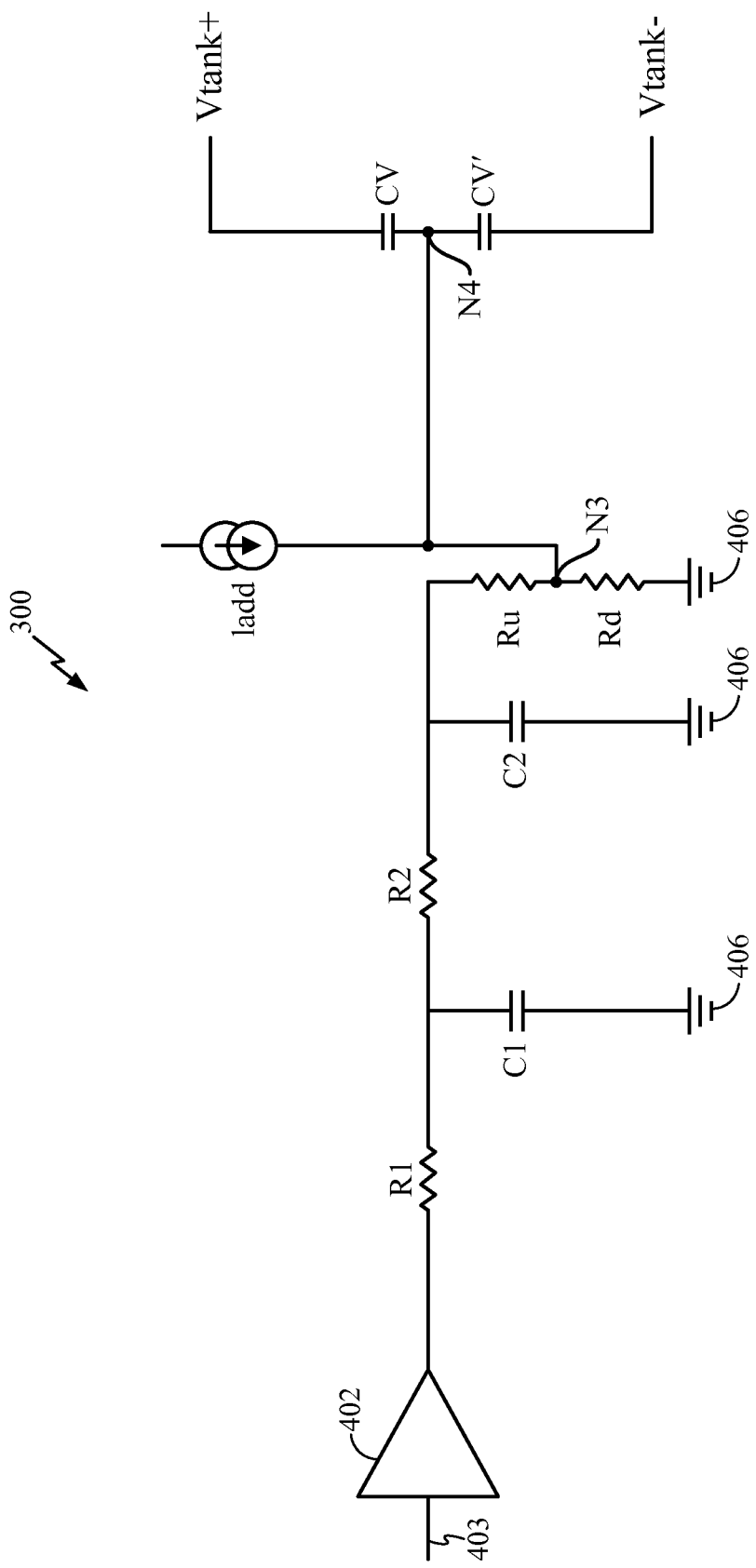
FIG. 5 is a circuit diagram of another varactor device, according to an exemplary embodiment of the present invention.

FIG. 5 illustrates a circuit diagram of another varactor device 300, according to another exemplary embodiment of the present invention. Similarly to varactor device 200, varactor device 300 includes variable capacitors CV and CV', wherein each of variable capacitors CV and CV' have one end coupled to a node N4. Moreover each of capacitor CV and CV' have another end respectively coupled to positive tank voltage Vtank+ and negative tank voltage Vtank−. According to one exemplary embodiment, capacitor CV may have one end directly coupled to a tank voltage and capacitor CV' may have one end directly coupled to a tank voltage. It is noted that varactor device 300 comprises a DC coupled varactor system. As noted above, positive tank voltage Vtank+ and negative tank voltage Vtank− may be coupled to respective positive and negative terminals of an oscillator (not shown), such as, for example only, an LC tank oscillator. Varactor device 300 further includes buffer 402, which, as noted above, may comprise, for example, a unity gain buffer. Buffer 402 may be configured to receive an input 403, which may be coupled to a PLL (not shown).

Varactor device 300 may also include a first RC filter including resistor R1 and capacitor C1 and a second RC filter including resistor R2 and capacitor C2. Additionally, varactor device 300 may include resistor Rd coupled in series between a ground voltage 406 and another resistor Ru. Furthermore, a node N3, which is positioned between resistors Rd and Ru, is coupled to each of variable capacitors CV and CV'. Varactor device 300 further includes current source Iadd coupled to node N3. It is noted that values for resistors Ru and Rd may be selected so that a voltage at node N3 is a fraction of a value of a tuning voltage at input 403. As an example, the resistor string including resistors Ru and Rd may be programmable so that the ratio of the voltage at node N3 to the tuning voltage at input 403 is, for example only, 0.2, 0.3, 0.4, 0.5, 0.6, 0.7, 0.8, or 0.9. Stated another way, the resistive values of resistors Ru and Rd may be programmable to meet implementation requirements. In addition, a value of current source Iadd may be selected to modify the voltage at a node N4 by a desired amount. It is noted that a voltage at node N4 may be referred to herein as an "adjusted tuning voltage." As noted above, the current generated by current source Iadd may maintain the center of a Kvco curve, as will be appreciated by a person having ordinary skill in the art.

A contemplated operation of varactor device 300 including example voltage values for input 403 (i.e., the tuning voltage) and node N4 (i.e., the adjusted tuning voltage) will now be discussed. Upon receipt of a voltage from a device, such as, for example, a PPL, buffer 402 may output a voltage. Moreover, in response to the voltage output from buffer and a current from current source Iadd, a voltage at node N4 may be generated at node N4. In the following example, resistors Ru and Rd are selected to provide a voltage at node N3 that is twenty percent (20%) of the tuning voltage at input 403 (i.e., the ratio of the voltage of node N3 to the tuning voltage at input 403 is 0.2) and Iadd is configured to boost the voltage a node N3 by 0.8 volts. Accordingly, by way of example only, if the tuning voltage (i.e., the voltage at input 403) comprises a voltage of 0.5 volts, the adjusted tuning voltage (i.e., the voltage at node N4) comprises 0.9 volts (i.e., 0.5 volt*0.2+0.8 volt=0.9 volt). Furthermore, by way of example only, if the tuning voltage comprises a voltage of 1.0 volt, the voltage at node N4 comprises 1.0 volt (i.e., 1.0 volt*0.2+0.8 volt=1.0 volts). Moreover, by way of example only, if the tuning voltage comprises a voltage of 1.5 volts, the voltage at node N4 comprises 1.1 volts (i.e., 1.5 volts*0.2+0.8 volt=1.1 volts). As a result, if the tuning voltage (i.e., the voltage at input 403) has a range of 1.0 volt (i.e., from 0.5 volts to 1.5 volts), the voltage at node N4 has a range of 0.2 volts (i.e., from 0.9 volts to 1.1 volts).

In comparison to conventional varactor devices, which comprise a plurality of varactor pairs, the exemplary embodiment described in regard to FIG. 5 comprises a single varactor pair. Furthermore, the varactor device enables the single varactor pair to be directly coupled to a tank oscillator. Accordingly, in comparison to conventional varactor devices, the varactor device described above in regard to FIG. 5 may enable for increased tuning range and decreased noise. Further, the varactor device may require less area than conventional varactor devices.

Figure 6:
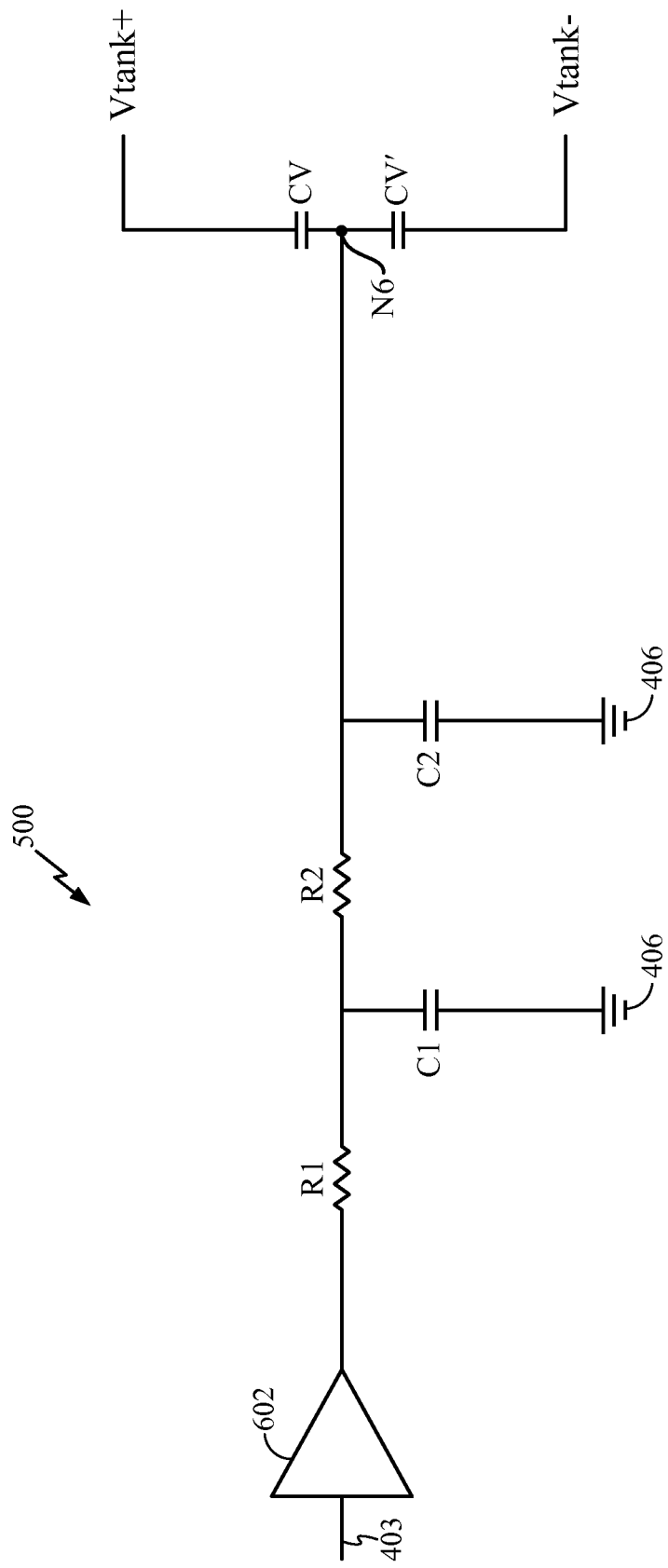
FIG. 6 is a circuit diagram of yet another varactor device, in accordance with an exemplary embodiment of the present invention.

FIG. 6 illustrates a circuit diagram of yet another varactor device 500, according to another exemplary embodiment of the present invention. Varactor device 500 includes variable capacitors CV and CV', wherein each of variable capacitor CV and CV' have one end coupled to a node N6. Moreover each of capacitor CV and CV' have another end respectively coupled to positive tank voltage Vtank+ and negative tank voltage Vtank−. According to one exemplary embodiment, capacitor CV may have one end directly coupled to a tank voltage and capacitor CV' may have one end directly coupled to a tank voltage. It is noted that varactor device 300 comprises a DC coupled varactor system. As previously noted, positive tank voltage Vtank+ and negative tank voltage Vtank− may be coupled to respective positive and negative terminals of an oscillator (not shown), such as, for example only, an LC tank oscillator. Varactor device 500 further includes buffer 602 configured to receive an input 403 (e.g., from a PLL (not shown)) and convey a voltage at node N6. Varactor device 500 may also include a first RC filter including resistor R1 and capacitor C1 and a second RC filter including resistor R2 and capacitor C2.

It is noted that buffer 602 is configured to receive an input voltage and convey a voltage comprising a voltage offset (e.g., 0.8 volt) and a voltage gain (e.g., 20%). It is further noted that a voltage at input 403 may be referred to herein as a "tuning voltage" and a voltage at node N6 may be referred to herein as an "adjusted tuning voltage." A contemplated operation of varactor system 500 including example voltage values for input 403 and node N6 will now be discussed. For example only, if buffer 602 receives a voltage of 0.5 volt, the voltage at node N6 may comprise 0.9 volt (i.e., 0.5 volts*0.2+ 0.8 volt=0.9 volts). Furthermore, by way of example only, if buffer 602 receives a voltage of 1.0 volt, the voltage at node N6 may comprise 1.0 volt (i.e., 1.0 volt*0.2+0.8 volt=1.0 volt). Moreover, by way of example only, if buffer 602 receives a voltage of 1.5 volts, the voltage at node N6 may comprise 1.1 volts (i.e., 1.5 volts*0.2+0.8 volt=1.1 volts). As a result, if the tuning voltage (i.e., the voltage at input 403) has a range of 1.0 volt (i.e., from 0.5 volt to 1.5 volts), the adjusted tuning voltage (i.e., the voltage at node N6) has a range of 0.2 volt (i.e., from 0.9 volt to 1.1 volts).

In comparison to conventional varactor devices, which comprise a plurality of varactor pairs, the exemplary embodiment described in regard to FIG. 6 comprises a single varactor pair. Furthermore, the varactor device enables the single varactor pair to be directly coupled to a tank oscillator. Accordingly, in comparison to conventional varactor devices, the varactor device described above in regard to FIG. 6 may enable for increased tuning range and decreased noise. Further, the varactor device may require less area than conventional varactor devices.

Figure 7:
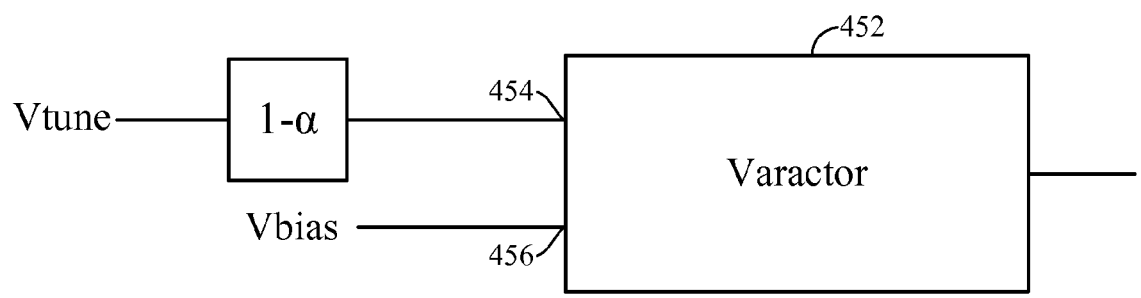
FIG. 7 is a simplified block diagram of a varactor device, according to an exemplary embodiment of the present invention.

FIG. 7 illustrates a simplified block diagram of a varactor device 450, in accordance with the exemplary embodiment described above with reference to FIGS. 5 and 6. Varactor device 450 includes a varactor 452 having a tuning node 454 configured to receive a tunable voltage. Varactor 452 also includes a bias node 456 configured to receive a bias voltage Vbias. As described above with reference to FIGS. 5 and 6, a tuning voltage received from a device (e.g., a PLL) may be multiplied by a factor of one minus alpha to generate a voltage to be applied to tuning node 454. As a non-limiting example, alpha may comprise 0.8 and, therefore, one minus alpha equals 0.2 (i.e., $1-\alpha=0.2$). Accordingly, a voltage applied across the positive and negative terminals of varactor 452 is reduced, thus, reducing the voltage range and enhancing linearity of an associated C-V curve. It is noted that the "offset voltage," as discussed above in regard to FIGS. 5 and 6 is not illustrated in FIG. 7.

Figure 8:
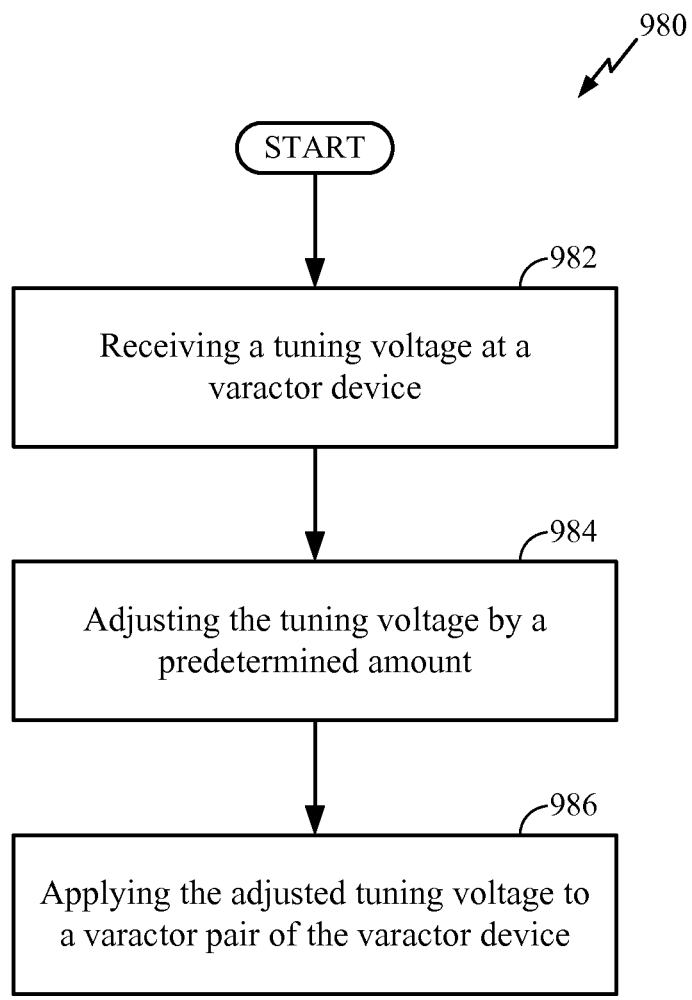
FIG. 8 is a flowchart illustrating another method, in accordance with an exemplary embodiment of the present invention.

FIG. 8 is a flowchart illustrating another method 980, in accordance with one or more exemplary embodiments. Method 980 may include receiving a tuning voltage at a varactor device (depicted by numeral 982). Method 980 may further include adjusting the tuning voltage by a predetermined amount (depicted by numeral 984). Moreover, method 980 may include applying the adjusted tuning voltage to a varactor pair of the varactor device (depicted by numeral 986).

Figure 10:
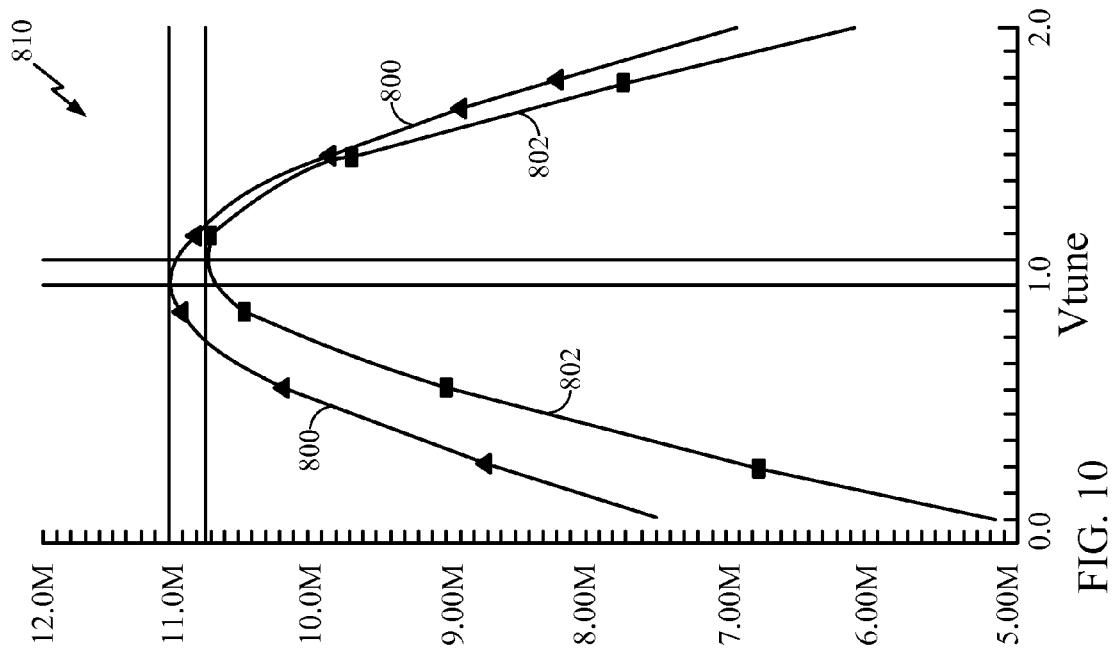
FIG. 10 is a plot illustrating the change in frequency across a range of tuning voltages for a conventional voltage controlled oscillator and a voltage controlled oscillator having a varactor according to an exemplary embodiment of the present invention.
Figure 9:
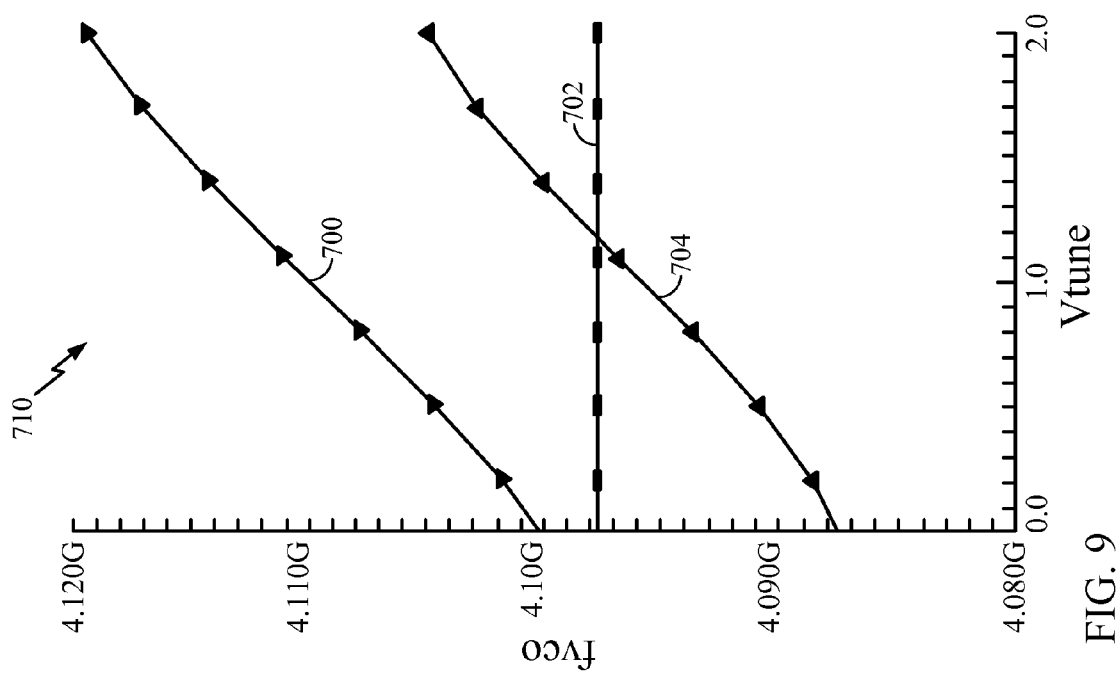
FIG. 9 is a plot illustrating frequencies across a range of tuning voltages for a conventional voltage controlled oscillator and a voltage controlled oscillator having a varactor in accordance with an exemplary embodiment of the present invention.

FIG. 9 is a plot 710 illustrating comparison curves of frequencies of VCOs across a range of tuning voltages Vtune. Curve 700 illustrates a frequency of a VCO having a varactor according to the exemplary embodiments described herein. Curve 702 illustrates a frequency of a VCO without a varactor and curve 704 illustrates a frequency of a VCO having a conventional varactor. As illustrated, in comparison to curve 704, curve 700 exhibits increased linearity over a range of tuning voltages Vtune. FIG. 10 is a plot 810 illustrating comparison curves of the change in frequency of VCOs across a range of tuning voltages Vtune. Curve 800 illustrates the change in frequency of a VCO having a varactor according to the exemplary embodiments described herein. Curve 802 illustrates the change in frequency of a VCO having a conventional varactor.

Figure 11:
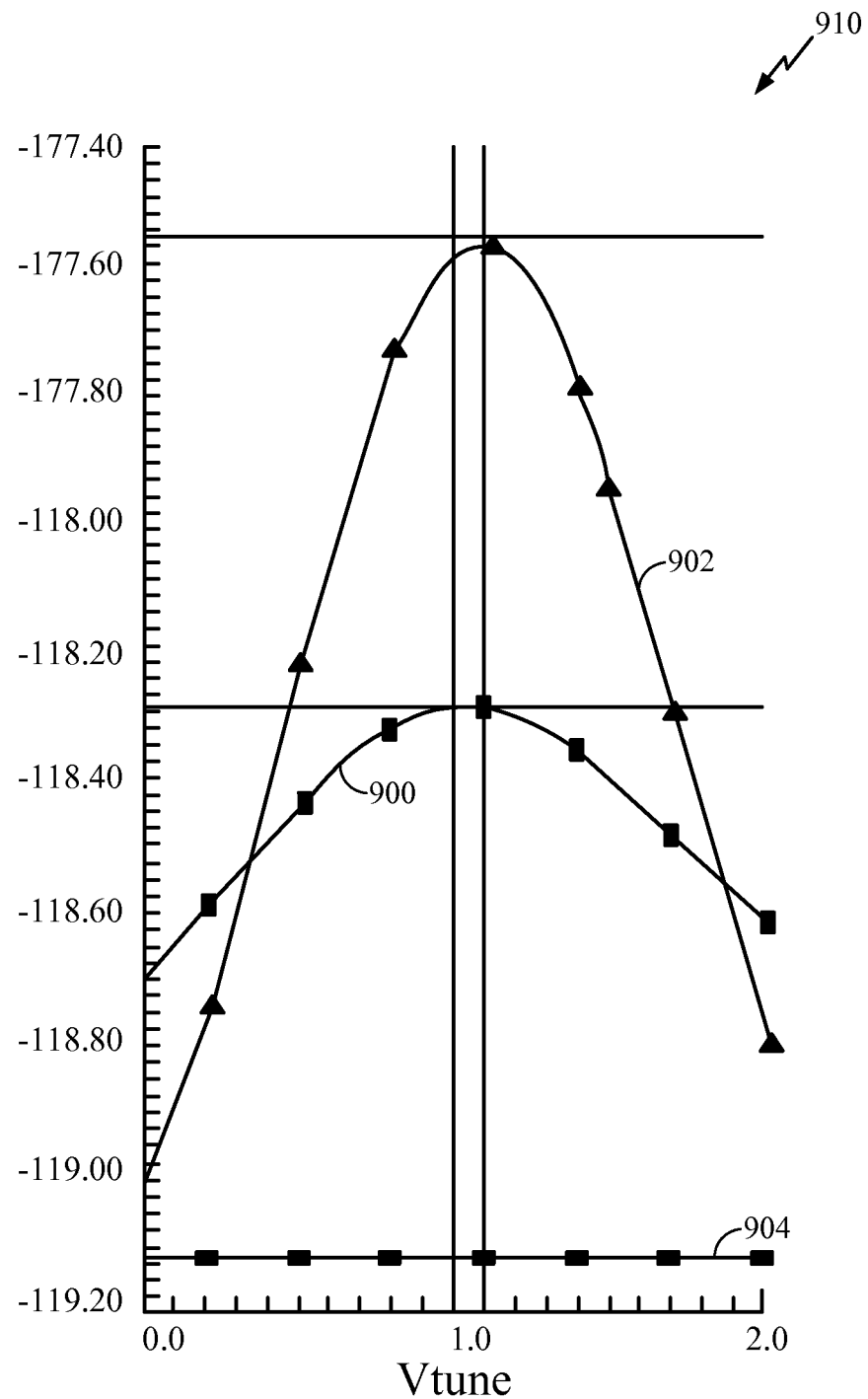
FIG. 11 is a plot illustrating phase noises across a range of tuning voltages for a conventional voltage controlled oscillator and a voltage controlled oscillator having a varactor in accordance with an exemplary embodiment of the present invention.

FIG. 11 is a plot 910 illustrating comparison curves of a phase noise of VCOs at a frequency of 400 kHz and across a range of tuning voltages Vtune. Curve 900 illustrates the phase noise of a VCO including a varactor according to the exemplary embodiments described herein. Curve 902 illustrates a frequency of a VCO without a varactor and curve 904 illustrates the phase noise of VCO including a conventional varactor. As illustrated, curve 900 exhibits approximately a 1 dB improvement over the phase noise of a VCO having a conventional varactor depicted by curve 902.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The current amplifier described herein may be implemented in an analog IC, an RFIC, an ASIC, a digital signal processor (DSP), a digital signal processing device (DSPD), a programmable logic device (PLD), a field programmable gate array (FPGA), a processor, a controller, a micro-controller, a microprocessor, and other electronic units. The current amplifier may be implemented in various IC process technologies such as N-MOS, P-MOS, CMOS, BJT, GaAs, etc. The dual-path current amplifier may also be implemented with discrete components.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
    an input device configured to receive a tuning voltage and generate a bias voltage, wherein the bias voltage is a combination of a fixed offset voltage and a fraction of the tuning voltage; and
    a single varactor pair coupled to the input device and having a first variable capacitor and a second variable capacitor, wherein each of the first variable capacitor and the second variable capacitor are configured for operable coupling to each of the bias voltage and the tuning voltage.

2. The device of claim 1, wherein the input device comprises a voltage divider coupled to the single varactor pair and configured to generate the bias voltage.

3. The device of claim 2, wherein a ratio of a voltage at a node between resistors of the voltage divider to the tuning voltage is 0.8.

4. The device of claim 2, wherein the input device further comprises a current source coupled to the voltage divider, wherein the current source and a resistor of the voltage divider are configured to generate the fixed offset voltage.

5. The device of claim 4, wherein the current source is configured to increase the bias voltage generated by the voltage divider.

6. The device of claim 1, further comprising a first coupling capacitor coupled between the first variable capacitor and a first terminal of a tank oscillator and a second coupling capacitor coupled between the second variable capacitor and a second terminal of the tank oscillator.

7. A method, comprising:
    receiving a tuning voltage at a single varactor pair having a first variable capacitor and a second variable capacitor; and
    applying a bias voltage to a first fixed coupling capacitor coupled to the first variable capacitor and a second fixed coupling capacitor coupled to the second variable capacitor, wherein the bias voltage is a combination of a fixed offset voltage and a fraction of the tuning voltage.

8. The method of claim 7, wherein the applying the bias voltage to the first fixed coupling capacitor coupled to the first variable capacitor and the second fixed coupling capacitor coupled to the second variable capacitor comprises generating the bias voltage in response to the tuning voltage.

9. The method of claim 8, wherein generating the bias voltage comprises generating the bias voltage with a voltage divider configured to receive the tuning voltage.

10. The method of claim 9, wherein the generating the bias voltage further comprises generating the bias voltage with a current source coupled to the voltage divider.

11. A device, comprising:
    means for receiving a tuning voltage at a single varactor pair having a first variable capacitor and a second variable capacitor; and
    means for applying a bias voltage to a first fixed coupling capacitor coupled to the first variable capacitor and a second fixed coupling capacitor coupled to the second variable capacitor, wherein the bias voltage is a combination of a fixed offset voltage and a fraction of the tuning voltage.

* * * * *